United States Patent [19]

Akamatsu

[11] 4,066,956
[45] Jan. 3, 1978

[54] SEMICONDUCTOR SWITCH DEVICE HAVING MEANS FOR SUPPLYING CONTROL CURRENT TO A CONTROL ELECTRODE

[75] Inventor: Masahiko Akamatsu, Amagasaki, Japan

[73] Assignee: Mitsubishi Denki Kabushiki Kaisha, Tokyo, Japan

[21] Appl. No.: 704,533

[22] Filed: July 12, 1976

[30] Foreign Application Priority Data

Sept. 12, 1975    Japan .................................. 50-111315

[51] Int. Cl.² .......................................... H02M 7/537
[52] U.S. Cl. ..................................................... 363/131
[58] Field of Search ................. 321/2, 43, 44; 331/112

[56] References Cited

U.S. PATENT DOCUMENTS

| 2,981,898 | 4/1961 | St. John | 331/112 |
| 3,072,837 | 1/1963 | Hakimoglu | 321/2 X |
| 3,562,668 | 2/1971 | Bartlett et al. | 321/2 X |
| 3,697,851 | 10/1972 | Mast | 321/2 |
| 3,909,696 | 9/1975 | Katov et al. | 321/2 |
| 3,924,172 | 12/1975 | Gregorich | 321/2 |
| 3,927,717 | 12/1975 | Kinnard | 321/2 |

OTHER PUBLICATIONS

IBM Technical Disclosure Bulletin, "Magnetic Multivibrator Amplifier", A. Hakimoglu, vol. 2, No. 6, Apr. 1960.

*Primary Examiner*—William M. Shoop
*Attorney, Agent, or Firm*—Oblon, Fisher, Spivak, McClelland & Maier

[57] ABSTRACT

A semiconductor switch device comprising: a semiconductor switch having at least one pair of control electrodes and at least one pair of main electrodes, the control electrodes being supplied with a control current while the semiconductor switch is maintained conductive between said main electrodes, and the main electrodes being serially inserted in a current path; and a transformer having a first conductor responding to a current passing said current path, a second winding connected to said control electrodes, a third winding producing a magnetomotive force reverse to that produced across said first conductor, and a fourth winding producing a control current to said control electrodes by induction from said third winding, the third winding being equipped with an electrical pulse applying means capable of causing said third winding to produce said reverse magnetomotive force.

13 Claims, 3 Drawing Figures

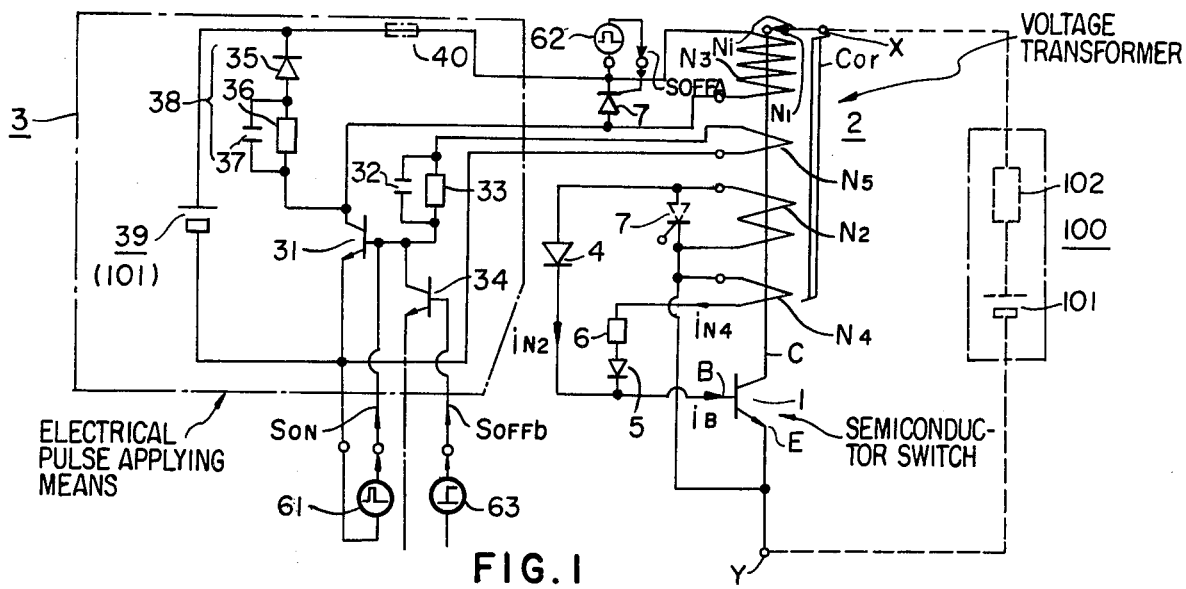
FIG. 1
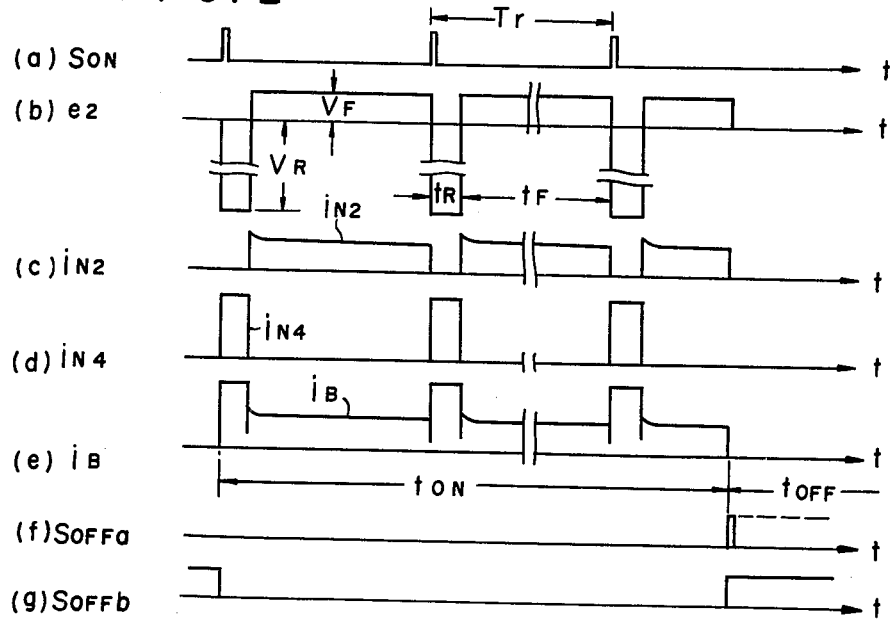
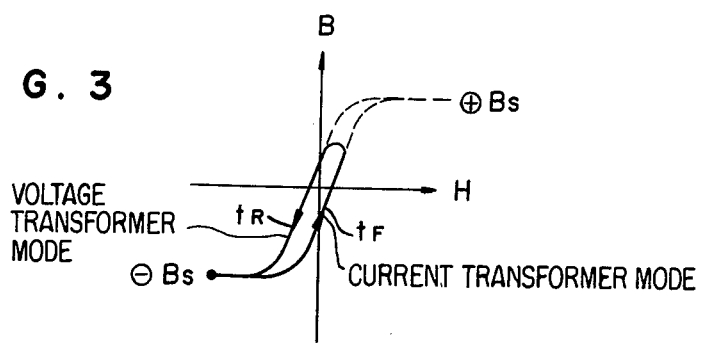

SEMICONDUCTOR SWITCH DEVICE HAVING MEANS FOR SUPPLYING CONTROL CURRENT TO A CONTROL ELECTRODE

BACKGROUND OF THE INVENTION

1. Field of the Invention

The present invention relates to improvements in semiconductor switch devices, and more particularly to a method for supplying a current to the control electrode of a semiconductor switch, e.g., a transistor switch.

2. Description of the Prior Art

In semiconductor switches, there has been a growing interest in the development of simplified means for supplying and controlling the control electrode current. In practice, such control current, if considerably large, can hardly be isolated and on-off controlled. To do this, prior art techniques have had to use a control electrode power source capable of isolated power supply for each switch unit, which has necessitated transformers and rectifiers of large capacity. When a large control electrode current is necessary to cope with a maximum main current, the power source must be large enough to deal with such current. One prior art approach to this problem is the method relevant to transistor inverters in which an AC current transformer is used for operation responding to a main current flow in the semiconductor switch, and the transformer output current is supplied to the control electrode of the semiconductor switch. In this method, however, the AC current transformer is inoperable for main current containing a DC component. Hence this method is virtually impractical for chopper control devices used for turn-on time controls. In applications to relatively low frequency inverters such as commercial frequency inverters and variable frequency inverters, the prior art approach is not practical, particularly in view of the fact that it requires a current transformer of large capacity.

SUMMARY OF THE INVENTION

It is therefore an object of the present invention to provide a semiconductor switch device incorporating a simple means for supplying a control current to the control electrode.

The object of the present invention is achieved by a semiconductor switch in a power path, the power path having two terminals and supplied with main current. The semiconductor switch device comprises: a semiconductor switch having first and second main current electrodes and a control electrode, the first main current electrode adapted to be connected to one of the two terminals of the power path, the semiconductor switch being rendered conductive across the main current electrodes when a forward current is supplied to the control electrode; a voltage transformer having a core, a first winding, a second winding, a third winding, and a fourth winding, the first winding having one end connected to the second main electrode of said semiconductor switch and adapted to have the other end connected to the other of the two terminals of the power path, main current flowing through the first winding producing a first magnetomotive force, the second winding being connected between the first main electrode and the control electrode of the semiconductor switch, whereby a forward current responsive to the main current flowing through the first winding is supplied from the second winding to the control electrode, the fourth winding being connected between the first main electrode and the control electrode of the semiconductor switch; and electrical pulse applying means for applying an electrical pulse to the third winding of said voltage transformer, the resulting current flowing through the third winding producing a second magnetomotive force opposite to the first magnetomotive force, whereby a forward current responsive to the current flowing through the third winding is supplied from the fourth winding to the control electrode.

Further objects, features and advantages of the invention will become more apparent from the following description taken in conjunction with the accompanying drawings, wherein:

BRIEF DESCRIPTION OF THE DRAWINGS

FIG. 1 is a circuit diagram showing one embodiment of the invention;

FIG. 2 is a waveform diagram for illustrating operations of the circuit shown in FIG. 1, and FIG. 3 is a graphic diagram showing B-H characteristics of the transformer core operated in the circuit of FIG. 1.

DETAILED DESCRIPTION OF THE PREFERRED EMBODIMENT

Referring to FIG. 1, there is schematically shown a switch circuit embodying the invention, which comprises a semiconductor switch 1 and a voltage transformer 2. The semiconductor switch 1 has a pair of main electrodes C and E inserted serially in a power path X-Y. The transformer 2 has a first winding (or first conductor) $N_1$ inserted in the main current path for the semiconductor switch 1, and a second winding $N_2$ connected to the control electrode B and one of the main electrodes E of the semiconductor switch 1. The second winding $N_2$ is connected forwardly to electrodes B and E through a rectifier element 4 and supplies electrodes B and E with a current induced by the flow of current $i_1$ in the first winding. The transformer 2 further comprises a third winding $N_3$ for providing a magnetomotive force opposite to that of the first winding, and a fourth winding $N_4$ for supplying the electrodes B and E with a control current induced by the flow of current in the third winding $N_3$. The fourth winding $N_4$ is connected to electrodes B and E through a rectifier element 5 and a suitable current adjusting element 6 such as resistor. An electrical pulse applying means 3 is provided for causing the third winding $N_3$ to generate a magnetomotive force.

The switch circuit further comprises a short-circuit switch 7 consisting essentially of a thyristor, which is provided to quickly break the second winding current $i_{N2}$ induced by the first winding current $i_1$. When a time lag, e.g., 100 usec to several msec, taken by the core Cor of the transformer 2 to be saturated is permissible as in a switch device for low speed switching, the need for the short-circuit switch 7 is obviated because the core is saturated by stopping the application of an electrical pulse and hence the second winding current $i_{N2}$ ceases.

In FIG. 1, the transformer 2 has a current transformer mode in which the first and second windings $N_1$ and $N_2$ operate as the primary and secondary windings respectively, and a voltage transformer mode in which the third and fourth windings $N_3$ and $N_4$ operate as the primary and secondary windings. FIG. 2 shows waveforms; the period $t_F$ corresponds to the current transformer mode, and the period $t_R$ to the voltage transformer mode. The magnetic flux density of the core varies forward during the period $t_F$ or reversely during the period $t_R$ as shown by B-H loop in FIG. 3. The symbols used in FIG. 2 correspond to those indicating current or voltage in FIG. 1. In FIG. 2, the symbol $e_2$ denotes the second winding emf of the transformer 2.

The switch circuit of the invention shown in FIG. 1 operates in the following manner. At the beginning of turn-on operation, a negative voltage is applied to the third winding $N_3$ from the pulse applying means 3, to activate the transformer and thus resetting the core flux. The flux varies along $t_R$ in FIG. 3. Concurrently, a control electrode current $i_B$ is supplied by way of the loop: fourth winding $N_4$—current adjusting element 6—rectifier element 5—electrodes B and E, in the waveform (d) in FIG. 2. For this period, the transformer negative voltage is $V_R$. (Instead of this operation, turn-on operation may be started in such manner that the short-circuit switch 7 is opened, a small amount of initial control electrode current is supplied from other means and thus turn-on operation is initiated from the current transformer mode.)

Then the application of the pulse voltage is stopped, causing the core flux to vary forward by the main current $i_1$ and thereby inducing a positive voltage. As a result, a secondary current $i_{N2}$ (i.e., the control electrode current) flows by way of the loop: second winding $N_2$—rectifier element 4—electrodes B and E, in the waveform (c) in FIG. 2.

For the necessary turn-on period $t_{ON}$, the two modes are repeated to enable a continuous control electrode current to be maintained in the waveform (e) in FIG. 2. In practice, a small dip of control electrode current $i_B$ will be present on a transition from one transformer mode to the other. This dip lasts but a very short period of time and is virtually negligible.

To break the control electrode current, the application of the pulse voltage is stopped to cause the transformer core to be saturated in a given length of time whereby the second winding current $i_{N2}$, e.g., the control electrode current $i_B$ ceases.

To quickly break the control electrode current, the application of the pulse voltage is stopped whereby the control electrode current ceases immediately, during the voltage transformer mode $t_R$. While, in the current transformer mode $t_F$, the short-circuit switch 7 is shorted whereby the second winding current $i_{N2}$ induced by the main current $i_1$ in the first winding $N_1$ goes to a short-circuit winding (common to the third winding $N_3$ in this embodiment) connected to the short-circuit switch, causing the control electrode current $i_B$ to cease. In this circuit, the short-circuit switch 7 may be connected to the second winding as indicated by the dotted line or another winding may be installed.

By the above arrangement, the necessary number of flux interlinkages in the transformer 2 is maintained free of the turn-on time $t_{ON}$ or can be determined by the pulse applying period $T_r = (t_R + t_F)$. By determining the period $T_r$ to be short (e.g., 100 usec to 1 msec), the size of the transformer can be markedly reduced. Therefore the transformer 2 may be ferrite type such as a small pulse transformer. The negative voltage $V_R$ in the voltage transformer mode may be increased to maintain the condition $t_F > t_R$. In this manner, a control electrode current proportional to the main current $i_1$ can be supplied for most of the period $t_F$. In other words, the control electrode current can be efficiently applied with respect to the base drive for the transistor. For the period $t_F$, the control electrode current is self-supplied from the main current. Thus, according to the invention, the means for supplying the control electrode current can be simplified.

An improved pulse applying means 3 of the invention will be described below in reference to FIG. 1. The pulse applying means 3 has a power source 39, which may be part of the main power source 101 comprised in the main network 100 having a main power source 101 and a load 102 and connected across the power path X-Y. The circuit comprises an auxiliary switch 31 consisting essentially of a transistor for turning off the supply of power from the power source 39 to the third winding $N_3$. A surge absorbing means 38 is provided comprising a rectifier element 35, a resistor 36 and a capacitor 37, to absorb a surge voltage present when the auxiliary switch 31 is turned off.

According to this embodiment, a detection means (fifth winding $N_5$) is provided for the transformer 2 in order to control the auxiliary switch 31, or the auxiliary switch 31 is controlled by way of a feedback coupling circuit (31, 32, 33 and $N_5$) in response to the output of the detection means $N_5$.

In this circuit construction, the auxiliary switch 31 becomes conducting by an on-trigger signal $S_{ON}$ supplied from a means 61, causing a voltage to be applied to the third winding $N_3$, a voltage to be induced across the fifth winding $N_5$, the auxiliary switch 31 to be kept conducting through the feedback coupling circuit, and the voltage transformer mode to be effected. When the flux level of the transformer core Cor goes to the negative saturation region $\ominus B_s$ on the B-H loop in FIG. 3, the electromotive force across the fifth winding $N_5$ decreases and the effect of maintaining the auxiliary switch conducting ceases to make the auxiliary switch nonconducting. Accordingly, the voltage transformer mode is switched to the current transformer mode. Thus, when the core flux level reaches its negative saturation, it becomes possible to automatically stop the application of a pulse provided from the auxiliary switch. By applying an on-trigger signal $S_{ON}(a)$ in FIG. 2 having a period $T_r$, the foregoing repeating operation is performed.

A feedback releasing means 34 is provided for releasing the feedback maintaining the auxiliary switch 31 conducting and thus compulsorily turning off the auxiliary switch 31. The means 34 operates, for example, to close (or short) or open the control electrodes of the auxiliary switch 31. The switch means 34 causes a means 63 to generate a signal $S_{OFFb}$ (g) in FIG. 2 for turning off the main semiconductor switch for a period $t_{OFF}$. Another signal $S_{OFFa}$ (f) in FIG. 2 to be applied to the short-circuit switch 7 can be a pulse present in the beginning of period $t_{OFF}$ or a signal present over the period $t_{OFF}$ as indicated by the dotted line.

The short-circuit switch 7 can be a thyristor or a diode-transistor series. The auxiliary switch 31 and the feedback releasing switch 34 are preferably transistors; however, these switches can be thyristor or other semiconductor switches.

According to the invention, as has been described, a simple transformer means is utilized to provide the control electrode current efficiently in a semiconductor switch device of the type in which the control electrode current is maintained for the period the main current circulates.

While one preferred embodiment of the invention and specific modifications thereof have been described, it is to be understood that many variations may occur to those skilled in the art without departing from the true spirit of the present invention. For example, obvious variations can be made in the arrangement of series connections; PNP or NPN transistors can be substituted; and the P gate thyristor can be substituted. It is therefore to be understood that within the scope of the appended claims, the invention may be practiced otherwise than as specifically described herein.

What is claimed as new and desired to be secured by Letters Patent of the United States is:

1. A semiconductor switch device comprising: a semiconductor switch having at least one pair of control electrodes and at least one pair of main electrodes, the control electrodes being supplied with a control current while the semiconductor switch is maintained conductive between said main electrodes, and the main electrodes being serially inserted in a current path; and a transformer having a first conductor responding to a current passing said current path, a second winding connected to said control electrodes, a third winding producing a magnetomotive force reverse to that produced across said first conductor, and a fourth winding producing a control current to said control electrodes by induction from said third winding, the third winding being equipped with an electrical pulse applying means capable of causing said third winding to produce said reverse magnetomotive force.

2. In a power path having two terminals and supplied with main current, a semiconductor switch device comprising:
    a semiconductor switch having two main current electrodes and a control electrode, one of the main current electrodes adapted to be connected to one of the two terminals of the power path, said semiconductor switch being rendered conductive across the main current electrodes when a forward current is supplied to the control electrode;
    a transformer having a core, a first winding, a second winding, a third winding, and a fourth winding, the first winding having one end connected to the other of the main electrodes of said semiconductor switch and adapted to have the other end connected to the other of the two terminals of the power path, main current flowing through the first winding producing a first magnetomotive force, the second winding being connected between the one of the main electrodes and the control electrode of said semiconductor switch, whereby a forward current responsive to the main current flowing through the first winding is supplied from the second winding to the control electrode, the fourth winding being connected between the one of the main electrodes and the control electrode of said semiconductor switch; and
    electrical pulse applying means for applying an electrical pulse to the third winding of said transformer, the resulting current flowing through the third winding producing a second magnetomotive force opposite to the first magnetomotive force, whereby a forward current responsive to the current flowing through the third winding is supplied from the fourth winding to the control electrode.

3. A semiconductor switch device according to claim 1 wherein said semiconductor switch is a transistor.

4. A semiconductor switch device according to claim 3 wherein one end of said second winding is connected to the control electrode of said semiconductor switch through a rectifier element, and the other end thereof is directly connected to the first main electrode of said semiconductor switch.

5. A semiconductor switch device according to claim 4 wherein one end of said fourth winding is connected to the control electrode of said semiconductor switch through a rectifier element and a current adjusting means, and the other end thereof is directly connected to the first main electrode of said semiconductor switch.

6. A semiconductor switch device according to claim 5 including a short-circuit switch connected across the third winding of said transformer.

7. A semiconductor switch device according to claim 6 wherein said electrical pulse applying means includes a DC power source and an auxiliary semiconductor switch having a control electrode and connected in series with said DC power source.

8. A semiconductor switch device according to claim 7 wherein said electrical pulse applying means includes surge absorbing means connected across the third winding of said transformer for absorbing a surge voltage occurring when said auxiliary semiconductor switch is turned off.

9. A semiconductor switch device according to claim 8 wherein said transformer includes a fifth winding connected between the DC power source and the control electrode of the auxiliary semiconductor switch in said electrical pulse applying means, said auxiliary semiconductor switch being rendered conductive when a forward current is supplied to the control electrode thereof, whereby a forward current responsive to the current flowing through the third winding is supplied from the fifth winding to the control electrode of said auxiliary semiconductor switch.

10. A semiconductor switch device according to claim 3 wherein said semiconductor switch is a PNP transistor.

11. A semiconductor switch device according to claim 3 wherein the semiconductor switch is a NPN transistor.

12. A semiconductor switch device according to claim 6 wherein the short-circuit switch is an N gate thyristor.

13. A semiconductor switch device according to claim 6 wherein the short-circuit switch is a P gate thyristor.

* * * * *